US009113261B2

(12) United States Patent
Akino et al.

(10) Patent No.: US 9,113,261 B2
(45) Date of Patent: Aug. 18, 2015

(54) UNIDIRECTIONAL CONDENSER MICROPHONE AND METHOD FOR ADJUSTING ACOUSTIC RESISTANCE

(71) Applicant: KABUSHIKI KAISHA AUDIO-TECHNICA, Machida-shi, Tokyo (JP)

(72) Inventors: Hiroshi Akino, Machida (JP); Tatsuya Ikeda, Machida (JP); Satoshi Yoshino, Machida (JP)

(73) Assignee: KABUSHIKI KAISHA AUDIO-TECHNICA, Machida-Shi, Tokyo (JP)

( * ) Notice: Subject to any disclaimer, the term of this patent is extended or adjusted under 35 U.S.C. 154(b) by 255 days.

(21) Appl. No.: 13/763,019

(22) Filed: Feb. 8, 2013

(65) Prior Publication Data

US 2013/0216084 A1  Aug. 22, 2013

(30) Foreign Application Priority Data

Feb. 22, 2012  (JP) .................................. 2012-036292

(51) Int. Cl.
*H04R 1/32*   (2006.01)
*H04R 1/34*   (2006.01)
*H04R 19/04*  (2006.01)

(52) U.S. Cl.
CPC ................ *H04R 1/326* (2013.01); *H04R 1/342* (2013.01); *B81B 2201/0257* (2013.01); *H04R 19/04* (2013.01); *H04R 2201/003* (2013.01)

(58) Field of Classification Search
CPC ........ H04R 1/326; H04R 1/342; H04R 1/083; H04R 1/086; H04R 1/08; H04R 19/04; H04R 19/16; H04R 19/02; H04R 19/013; H04R 19/0005; H04R 23/006; H04R 17/00; H04R 2499/11; H04R 2201/003; B81B 2201/0257
USPC ......... 381/346, 113, 116, 174, 175, 190, 191, 381/355; 181/175; 257/415, 416, 419
See application file for complete search history.

(56) References Cited

U.S. PATENT DOCUMENTS 3,876,843 A * 4/1975 Moen ............................. 381/313
2004/0125975 A1 * 7/2004 Suzuki et al. ................. 381/369

FOREIGN PATENT DOCUMENTS

JP              3166950      *  3/2011  ............. B65D 51/18

* cited by examiner

*Primary Examiner* — Davetta W Goins
*Assistant Examiner* — Oyesola C Ojo
(74) *Attorney, Agent, or Firm* — Manabu Kanesaka

(57) ABSTRACT

To provide an insulator, which supports a fixed pole in a unidirectional condenser microphone in a shareable manner among microphones that are different in the distance between acoustic terminals from one another. Coarse adjustment is performed on an insulator 31 including a plurality of sound holes 32 drilled therein by acoustically closing a predetermined sound hole 32 among the plurality of sound holes 32 by a predetermined sound hole closing means, and fine adjustment is performed by applying a predetermined amount of compressive force to an acoustic resistance member 40 by an acoustic resistance adjusting means 50 (adjustment nut 51), so as to adjust acoustic resistance present in a sound wave passage from a rear acoustic terminal to the back of a diaphragm.

9 Claims, 9 Drawing Sheets

FIG. 4A
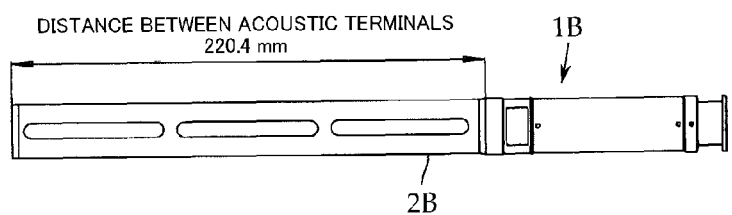
FIG. 4B
FIG. 4C
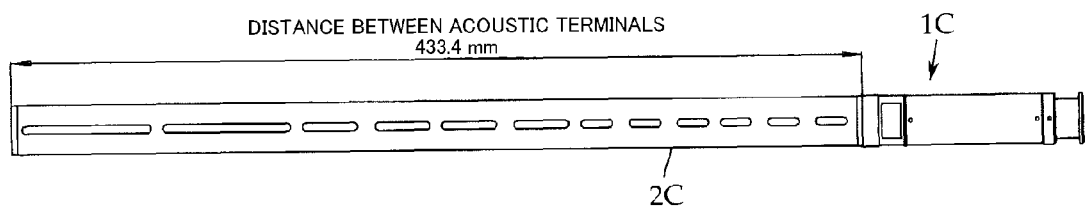
FIG. 5
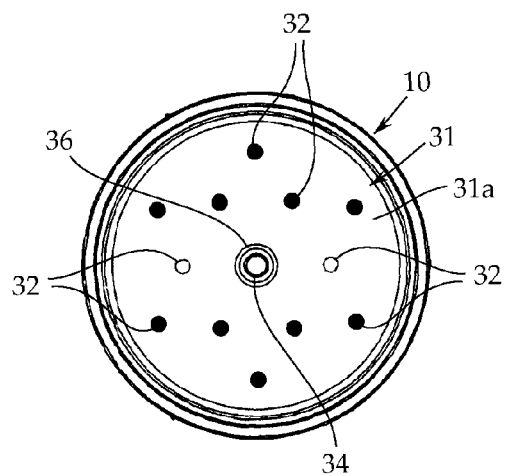

UNIDIRECTIONAL CONDENSER MICROPHONE AND METHOD FOR ADJUSTING ACOUSTIC RESISTANCE

CROSS-REFERENCE TO RELATED APPLICATION

The present application is based on, and claims priority from, Japanese Application Serial Number JP2012-036292, filed Feb. 22, 2012, the disclosure of which is hereby incorporated by reference herein in its entirety.

TECHNICAL FIELD

The present invention relates to a unidirectional condenser microphone and method for adjusting acoustic resistance, and in particular, to a technique of providing an insulator, which supports a fixed pole, in a shareable manner among unidirectional condenser microphones that are different in the distance between acoustic terminals from one another.

BACKGROUND ART

Unidirectional condenser microphones include a front acoustic terminal for capturing sound waves from a sound source on the front side of a diaphragm and a rear acoustic terminal for capturing the sound waves on the back side of the diaphragm, and take advantage of acoustic resistance to adjust bi-directional components captured from the rear acoustic terminal.

The value of acoustic resistance on the rear acoustic terminal side is designed based not only on a required directivity (for example, cardioid, hypercardioid, supercardioid and the like) and stiffness in an air chamber present on the rear of the fixed pole, but also on the distance between the front and rear acoustic terminals (see "Analysis of the Miniaturization of Directional Condenser Microphone" by Mizoguchi Akio, Journal of The Acoustical Society of Japan, Vol. 31, No. 5, 1975, FIG. 1, in particular).

In normal unidirectional condenser microphones, since the distance between acoustic terminals is at most 5 cm or less, a relatively low acoustic resistance value is used.

In contrast, narrow directional microphones with an acoustic tube attached to a microphone unit thereof may have the distance between acoustic terminals that may reach as long as 50 cm at a low frequency.

Consequently, the front side of the diaphragm of the condenser element is subject to an acoustic mass in the acoustic tube, and in order to achieve unidirectivity, such as hypercardioid, a considerably high acoustic resistance value is needed on the rear acoustic terminal side. In addition, for precise directivity, fine tunability is requisite while such a high acoustic resistance value is maintained.

In a condenser microphone, the fixed pole is supported on an insulator. In a microphone of unidirectional type, a perforated electrode plate is used for the fixed pole and sound holes are drilled in the insulator as sound wave passages such that sound waves from the rear acoustic terminal act on the back side of the diaphragm. Moreover, an air chamber is present between the insulator and the fixed pole. The insulator is therefore an important element for designing an acoustic resistance value.

Meanwhile, since the fixed pole is connected to a gate of a field-effect transistor (FET) that serves as an impedance converter through an electrode feedthrough rod inserted through the insulator, the insulator is composed of a material that has high volume and surface resistivities, for example, polycarbonate.

Even such a highly resistive material may undergo surface resistivity degradation because the material is more or less prone to brush marks and small cracks when it is cut to produce an insulator.

Injection molding is not likely to impose such a problem as with cutting. A normal unidirectional condenser microphone with a short distance between acoustic terminals and a narrow directional microphone with an acoustic tube, however, require a different number of sound holes with a different diameter drilled in the insulator in their connection with required acoustic resistance values.

Furthermore, even microphones of the same narrow directional type have a different number of sound holes with a different diameter drilled in the insulator in their connection with the acoustic resistance values depending on the length of the acoustic tube used. This entails a significant cost burden in order to produce a molding die for each model of microphone.

Accordingly, an object of the invention is to provide an insulator, which supports a fixed pole in a unidirectional condenser microphone and is preferably injection molded, in a shareable manner among microphones that are different in the distance between acoustic terminals from one another.

SUMMARY OF THE INVENTION

To solve the above problem, the present invention is characterized by a unidirectional condenser microphone including a microphone unit, the microphone unit including, in a cylindrical unit case having a front acoustic terminal on one end and a rear acoustic terminal on the other end: a diaphragm stretched over a support ring; a fixed pole; and an insulator supporting the fixed pole, the diaphragm and the fixed pole disposed to face each other and spaced a predetermined distance apart, the insulator including a plurality of sound holes drilled therein, the sound holes directing sound waves from the rear acoustic terminal to a back side of the diaphragm, the insulator including, on the back side thereof, an acoustic resistance member formed so as to cover all the sound holes and acoustic resistance adjusting means that applies compressive force to the acoustic resistance member to vary acoustic resistance of the member, wherein the acoustic resistance member is provided with sound hole closing means that acoustically closes a predetermined sound hole among the sound holes.

The sound hole closing means is composed of a non-air-permeable member provided at a location so as to face the sound hole of the acoustic resistance member in a pinpoint manner.

The non-air-permeable member is composed of a resin material applied or bonded to the acoustic resistance member.

The non-air-permeable member is composed of a heated and fused part of the acoustic resistance member.

The non-air-permeable member is shaped in a protrusion that fits into the sound hole.

The sound hole closing means is composed of a non-air-permeable sheet material disposed between the insulator and the acoustic resistance member, and the non-air-permeable sheet material includes an opening formed therein for allowing a sound hole other than the predetermined sound hole that is acoustically closed to be in communication with the acoustic resistance member.

The acoustic resistance adjusting means includes: an adjustment plate that is formed in a disk shape and is in contact with the entire back side of the acoustic resistance member for holding the acoustic resistance member between the adjustment plate and the insulator; and pressing means that variably applies pressing force to the adjustment plate, and sound waves from the rear acoustic terminal enter from a circumstantial surface of the acoustic resistance member.

The present invention relates to a method for adjusting acoustic resistance. It is characterized by a method for adjusting acoustic resistance of a unidirectional condenser microphone including a microphone unit, the microphone unit including, in a cylindrical unit case having a front acoustic terminal on one end and a rear acoustic terminal on the other end: a diaphragm stretched over a support ring; a fixed pole; and an insulator supporting the fixed pole, the diaphragm and the fixed pole disposed to face each other and spaced a predetermined distance apart, the insulator including a plurality of sound holes drilled therein, the sound holes directing sound waves from the rear acoustic terminal to a back side of the diaphragm, the insulator including, on the back side thereof, an acoustic resistance member formed so as to cover all the sound holes and acoustic resistance adjusting means that applies compressive force to the acoustic resistance member to vary acoustic resistance of the member, the method comprising: acoustically closing, as a coarse adjustment step, a predetermined sound hole among the sound holes by sound hole closing means; and applying, as a fine adjustment step, a predetermined amount of compressive force to the acoustic resistance member by the acoustic resistance adjusting means, so as to adjust acoustic resistance present in a sound wave passage from the rear acoustic terminal to the back of the diaphragm.

As sound hole closing means in the coarse adjustment step, a hardening resin is enclosed in the sound hole.

As sound hole closing means in the coarse adjustment step, a non-air-permeable member provided at a location so as to face the sound hole of the acoustic resistance member in a pinpoint manner is used.

As sound hole closing means in the coarse adjustment step, a non-air-permeable sheet material disposed between the insulator and the acoustic resistance member is used.

According to the present invention, the acoustic resistance value on the rear acoustic terminal side can be coarsely adjusted by using sound hole closing means to acoustically close a predetermined sound hole among a plurality of sound holes drilled in the insulator. Thereafter, acoustic resistance adjusting means can be used to apply a predetermined amount of compressive force to the acoustic resistance member so as to finely adjust the acoustic resistance value on the rear acoustic terminal side. Accordingly, an insulator can be designed according to specifications for a normal unidirectional condenser microphone with a short distance between acoustic terminals, and then the insulator can also be applied to a narrow unidirectional condenser microphone with a long distance between acoustic terminals.

BRIEF DESCRIPTION OF THE DRAWINGS

FIGS. 4A to 4C are side views illustrating 3 types of unidirectional condenser microphones that are different in the distance between acoustic terminals from one another;

FIG. 5 is a rear view of an insulator whose sound holes are plugged for use in the narrow unidirectional condenser microphone in FIG. 4C;

DETAILED DESCRIPTION

Embodiments of the present invention will now be described with reference to FIGS. 1 to 12, although the present invention is not limited to the embodiment.

Figure 1:
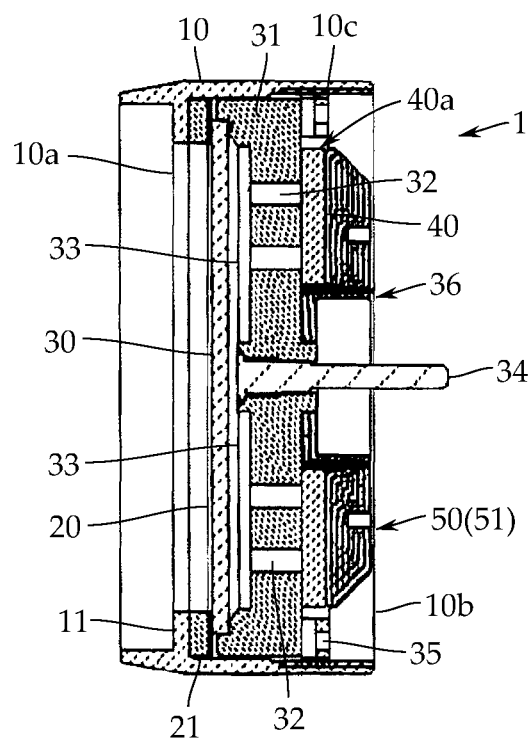
FIG. 1 is a sectional view illustrating an embodiment of a microphone unit included in a unidirectional condenser microphone according to the invention.

Referring first to FIG. 4, the present invention includes a unidirectional condenser microphone (also referred to simply as "microphone" hereinafter), such as a unidirectional condenser microphone 1A of normal form with the distance of, for example, 7.9 mm between acoustic terminals as shown in FIG. 4A, a narrow directional condenser microphone 1B that has a middle size acoustic tube 2B with the distance of, for example, 220.4 mm between acoustic terminals as shown in FIG. 4B, a narrow directional condenser microphone 1C that has a long size acoustic tube 2C with the distance of, for example, 433.4 mm between acoustic terminals as shown in FIG. 4C, the like. These condenser microphones 1A to 1C each include a microphone unit 1 as shown in FIG. 1.

The microphone unit 1 is provided with a cylindrical unit case 10 made of a metallic material such as brass alloy. In FIG. 1, the front opening portion on the left of the unit case 10 is a front acoustic terminal 10a directed to a sound source (not shown) during sound collection, and the rear opening portion on the right is a rear acoustic terminal 10b.

Note that, in a complete microphone, the unit case 10 is contained in a microphone case (not shown) and the microphone case is often provided with an opening for capturing sound waves from the back. In the narrow directional microphones 1B and 1C shown in FIGS. 4B and 4C, the acoustic tubes 2B and 2C are each directly connected to the front acoustic terminal 10a of the microphone unit 1.

In the unit case 10, an electroacoustic converter of electrostatic type is contained. The electroacoustic converter includes a diaphragm 20 stretched over a support ring (diaphragm ring) 21 and a fixed pole 30 supported on an insulator 31, which are disposed to face each other with a spacer member (not shown) interposed therebetween.

A thin film of synthetic resin with a metallized film applied on one side is used for the diaphragm 20. For the fixed pole 30, an electrode plate composed of an aluminum material, for example. For a back electret type, an electret dielectric film is integrally fused on the fixed pole 30. For a film electret type, an electret dielectric film is integrally fused on the diaphragm 20.

The insulator 31 is composed of a material that has high volume and surface resistivities, for example, polycarbonate. Although the insulator 31 may be produced by cutting, it may preferably be produced by injection molding in order to maintain a high surface resistivity.

A perforated plate is used for the fixed pole 30 such that sound waves from the rear acoustic terminal 10b act on the back side (on the side of the surface facing the fixed pole 30) of the diaphragm 20. Sound holes 32 are drilled in the insulator 31 as a plurality of sound wave passages.

An electrode feedthrough rod 34 is inserted through the center portion of the insulator 31. The electrode feedthrough rod 34 is electrically connected to the fixed pole 30 through a wiring that is not shown.

The unit case 10 has an internal thread 10c formed on the inner circumferential surface of the rear opening thereof. With a lock ring 35 provided with an external thread that is threadably engaged with the internal thread 10c pressing the insulator 31, the electroacoustic converter including the diaphragm 20 and the fixed pole is pressed from the back side, and rigidly secured between the insulator 31 and a stopper ring 11 provided on the side of the front opening of the unit case 10.

Note that when the unit case 10 is composed of an aluminum material that is susceptible to plastic deformation, for example, the back of the insulator 31 may be pressed by curling and caulking the edge of the rear opening end inwardly, instead of using the lock ring 35.

Figure 2:
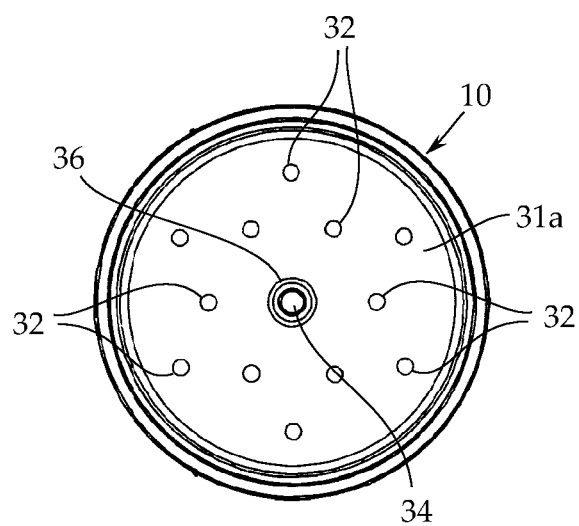
FIG. 2 is a rear view of the microphone unit seen from the back side of the insulator.
Figure 3:
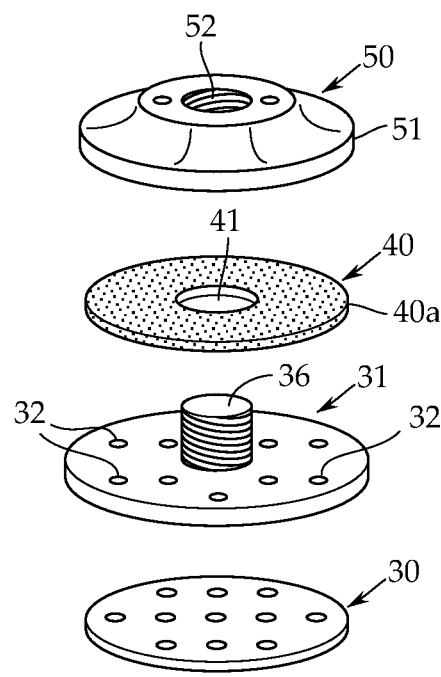
FIG. 3 is an exploded perspective view illustrating a configuration on the rear acoustic terminal side of the microphone unit.

Referring to both FIGS. 2 and 3, on the side of the back 31a (opposite side to the surface supporting the fixed pole), an acoustic resistance member 40 and acoustic resistance adjusting means 50 that applies compressive force to the acoustic resistance member 40 to vary acoustic resistance of the member.

In the embodiment, on the side of the fixed pole supporting surface of the insulator 31, an air chamber 33 in the form of a recess with a predetermined volume is formed. Although not shown, an acoustic resistance member composed of, for example, a felt material may also be contained in the air chamber 33.

The acoustic resistance member 40 is composed of an air-permeable sponge material, resin sheet, nonwoven fabric, or the like, and is formed in a disk shape with a predetermined thickness as to cover all the sound holes 32. Although the acoustic resistance member 40 is intended to be compressed by the acoustic resistance adjusting means 50, it may preferably be compressive-molded in advance at a predetermined compressibility.

In the embodiment, an adjustment nut 51 that covers one side of the acoustic resistance member 40 entirely as the acoustic resistance adjusting means 50.

To fix the adjustment nut 51, an externally threaded cylinder 36 that is threadably engaged with an internally threaded hole 52 in the adjustment nut 51 is provided in the center portion of the back side of the insulator 31. The acoustic resistance member 40 also includes a hole 41 drilled therein, into which the externally threaded cylinder 36 is inserted. Note that the electrode feedthrough rod 34 is inserted through the externally threaded cylinder 36.

Since the acoustic resistance member 40 is thus held between the insulator 31 and the adjustment nut 51, sound waves enter the acoustic resistance member 40 from a circumstantial surface 40a thereof, which is preferable for achieving a higher acoustic resistance.

The insulator 31 is provided with a plurality of sound holes 32. To provide the insulator 31 in a shareable manner among, for example, the microphones 1A, 1B and 1C shown in FIGS. 4A to 4C, the number of sound holes 32 is to be set such that the insulator 31 can also be applied to the unidirectional condenser microphone 1A of normal form shown in FIG. 4A, which is considered to be the lowest in the required acoustic resistance on the side of the rear acoustic terminal 10b.

In the embodiment, 12 sound holes 32, each of which has the diameter of 1 mm, are drilled in the insulator 31, the diameter of which is 24 mm. Each sound hole 32 preferably has the same diameter in order to adjust the acoustic resistance, although it is not necessary that the sound holes 32 are evenly arranged.

In the present invention, when adjusting the acoustic resistance, coarse adjustment is performed by closing a predetermined sound hole 32 and fine adjustment is then performed by compressing the acoustic resistance member 40.

As an example, in the coarse adjustment step, 1 to 3 among 12 sound holes 32 are closed in the case of the unidirectional condenser microphone 1A of normal form shown in FIG. 4A. In the case of the narrow directional middle microphone 1B shown in FIG. 4B, 9 sound holes are closed. In the case of the narrow directional long microphone 1C shown in FIG. 4C, 10 sound holes are closed. FIG. 5 shows the case where 10 sound holes are closed and 2 sound holes are left active (filled circles indicate closed sound holes).

Although the sound holes 32 may be closed by, for example, injecting epoxy resin or the like or applying a tape or the like, first sound hole closing means that is preferably adopted in the present invention will now be described with reference to FIG. 6.

Figure 6A:
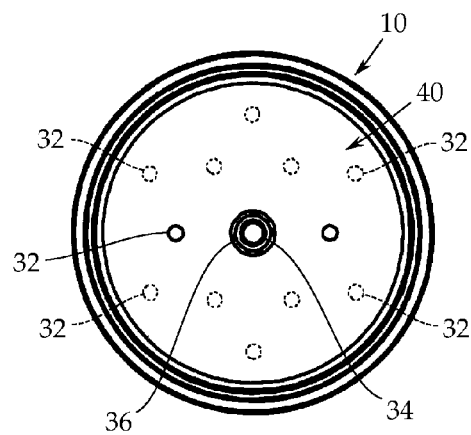
FIG. 6A is a rear view of an insulator whose sound holes are plugged an acoustic resistance member.
Figure 6B:
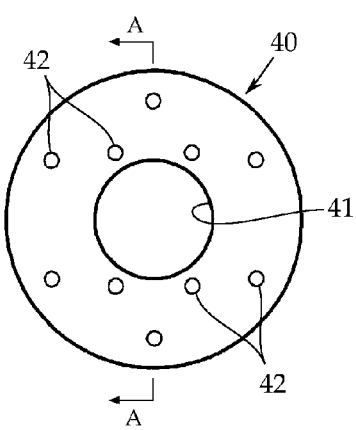
FIG. 6B is a front view illustrating the acoustic resistance member with sound hole closing means.

As shown in FIG. 6B, the first sound hole closing means is composed of a non-air-permeable member 42 provided at a location so as to face the sound hole 32 of the acoustic resistance member 40 in a pinpoint manner. For example, when 10 sound holes are closed and 2 sound holes are left active among 12 sound holes as shown in FIG. 5, non-air-permeable members 42 are provided at 10 locations corresponding to the respective sound holes indicated by filled circles in FIG. 5.

By disposing the acoustic resistance member 40 that has non-air-permeable members 42 to the side of the back 31a of the insulator 31 in this way, 10 sound holes 32 corresponding to the dotted circles shown in FIG. 6A are closed by the non-air-permeable members 42 and 2 sound holes 32 indicated by solid line circles are in communication with the acoustic resistance member 40.

The non-air-permeable member 42 may be composed of a resin material applied or bonded to the acoustic resistance member 40. In the case of the acoustic resistance member 40 composed of an air-permeable sponge material, resin sheet, or the like, a part of the material may be heated and fused to put the part into a non-air-permeable matted state.

Figure 6C:
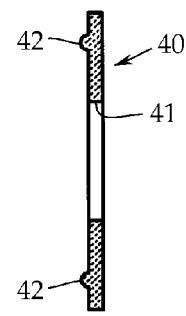
FIG. 6C is a sectional view taken along the line A-A in FIG. 6B.

As shown in FIG. 6C, it is also preferable that the non-air-permeable members 42 are shaped in a protrusion that fits into the sound hole 32. This can avoid displacement of the acoustic resistance member 40 caused by being accompanied and turned when the adjustment nut 51 is turned to compress the acoustic resistance member 40.

Referring to FIG. 7, a second sound hole closing means that is preferably adopted in the present invention will now be described.

Figure 7A:
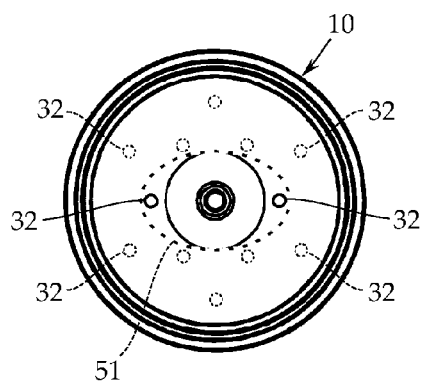
FIG. 7A is a rear view of an insulator whose sound holes are plugged by a non-air-permeable sheet material.
Figure 7B:
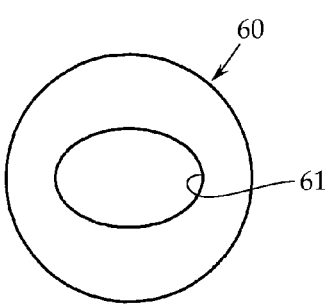
FIG. 7B is a front view illustrating the non-air-permeable sheet material.
Figure 7C:
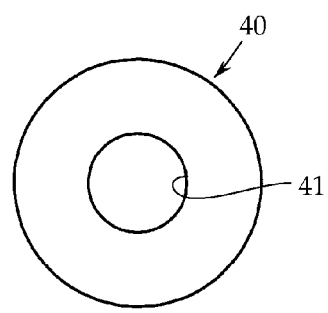
FIG. 7C is a front view illustrating an acoustic resistance member.
Figure 7D:
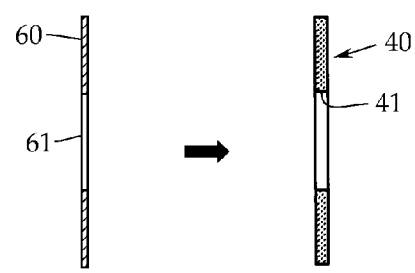
FIG. 7D is a sectional view illustrating the non-air-permeable sheet material being bonded to the acoustic resistance member.

The second sound hole closing means is composed of a non-air-permeable sheet material 60 as shown in FIG. 7B. The non-air-permeable sheet material 60 has substantially the same diameter as the acoustic resistance member 40 shown in FIG. 7C, and is arranged along one side (the surface facing the insulator 31) of the acoustic resistance member 40, which in this state, is disposed on the side of the back 31a of the insulator 31. A rear view shown in FIG. 7A illustrates the combined state.

The non-air-permeable sheet material 60 covers sound holes 32 that should be closed, while it is provided with an opening 61 for allowing other sound holes 32 to communicate with the acoustic resistance member 40.

For example, when 10 sound holes indicated by filled circles are closed and 2 sound holes indicated by hollow circles are left active among 12 sound holes as shown in FIG. 5, an elliptical opening 61 is provided in the center portion of the non-air-permeable sheet material 60 such that the 2 sound holes indicated by hollow circles are included within the opening.

Although the example in FIG. 7 is arranged to include 2 sound holes that are in communicate with the acoustic resistance member 40 within the elliptical opening 61, the opening 61 may separately provided for each one of sound holes that are in communicate with the acoustic resistance member 40, for example.

The non-air-permeable sheet material 60 may be a thermally fusible film material and may be thermally fused in advance to one side of the acoustic resistance member 40.

In any case, according to the first and second sound hole closing means, productivity can advantageously be increased in comparison with the case where a predetermined sound holes 32 are sealed by resin or other materials each time as required to provide the insulator 31 in a shareable manner among, for example, unidirectional condenser microphones shown in FIGS. 4A to 4C.

Next, taking the narrow directional long microphone 1C shown in FIG. 4C in the state where 10 sound holes are closed in advance and 2 sound holes are left active in a coarse adjustment as shown in FIG. 5, FIGS. 8 to 12 show polar patterns and directional frequency response characteristics obtained when the acoustic resistance value of the acoustic resistance member 40 is finely adjusted by means of the adjustment nut 51, which serves as the acoustic resistance adjusting means 50 (each polar pattern shown is obtained at 100 Hz).

Note that, in the example, a sponge material available from Bridgestone Corporation (type HR-50) that has been compressed to 1/5 (compressibility of 1/5) in advance is used as the acoustic resistance member 40. The acoustic resistance member 40 is further compressed in the axial direction by 0.2 mm, which corresponds to approximately 4%, every 0.5 turns (180° turns) of the adjustment nut 51.

Figure 8A:
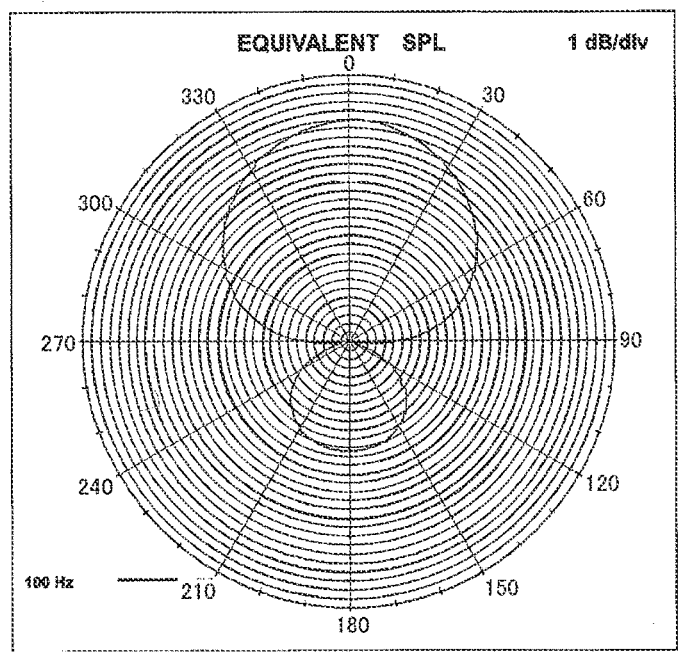
FIG. 8A illustrates a polar pattern obtained at the time of fine adjustment by means of an adjustment nut (0 turns) of an acoustic resistance member.
Figure 8B:
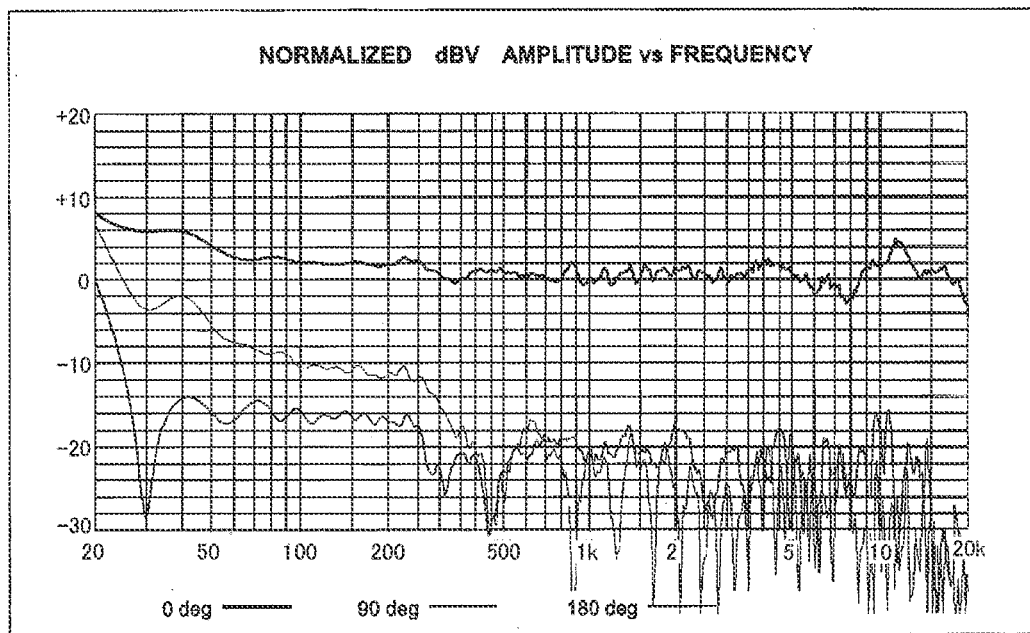
FIG. 8B is a graph showing a directional frequency response for the pattern in FIG. 8A.

First, FIGS. 8A and 8B show a polar pattern and a directional frequency response characteristic obtained in an uncompressed state where the compressive force exerted on the acoustic resistance member 40 by the adjustment nut 51 is substantially zero (0.0 turns and compressibility unchanged from 1/5).

Figure 9A:
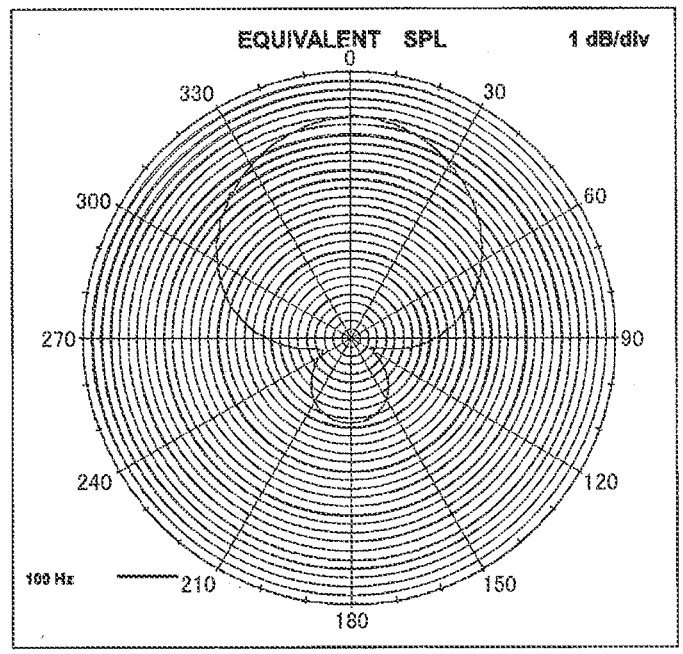
FIG. 9A illustrates a polar pattern obtained at the time of fine adjustment by means of an adjustment nut (0.5 turns) of an acoustic resistance member.
Figure 9B:
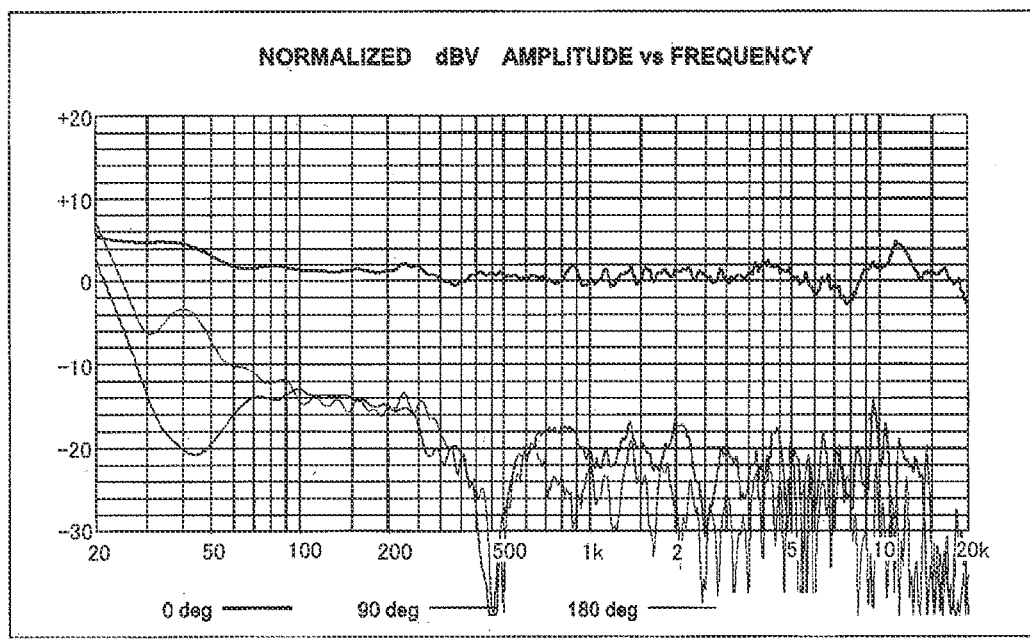
FIG. 9B is a graph showing a directional frequency response for the pattern in FIG. 9A.

Next, FIGS. 9A and 9B show a polar pattern and a directional frequency response characteristic obtained when the adjustment nut 51 is turned by 0.5 turns (180° turns) to change the compressibility of the acoustic resistance member 40 from 1/5 of 0.0 turns to 1/6.25.

Figure 10A:
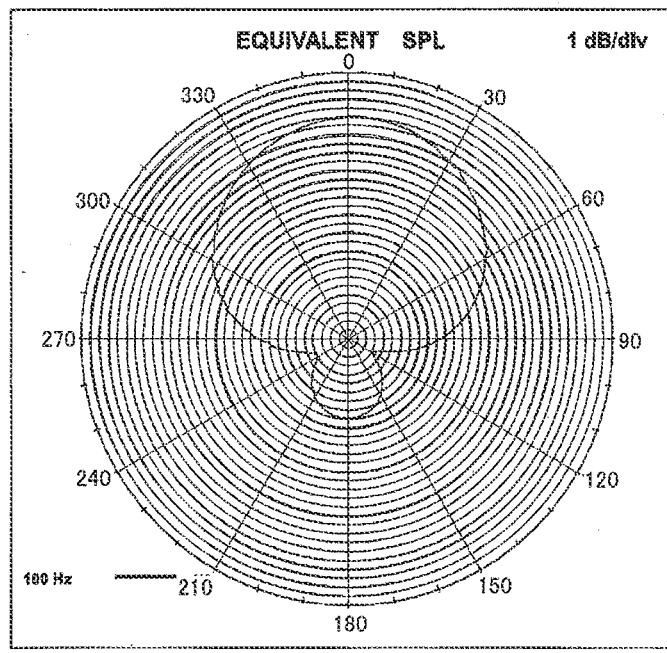
FIG. 10A illustrates a polar pattern obtained at the time of fine adjustment by means of an adjustment nut (1.0 turn) of an acoustic resistance member.
Figure 10B:
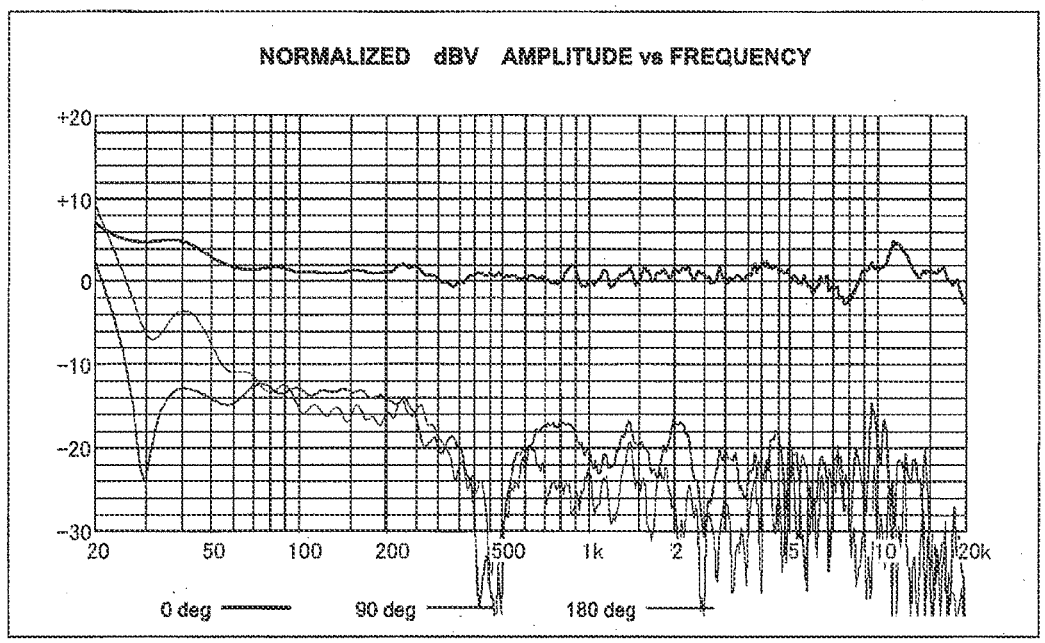
FIG. 10B is a graph showing a directional frequency response for the pattern in FIG. 10A.

Next, FIGS. 10A and 10B show a polar pattern and a directional frequency response characteristic obtained when the adjustment nut 51 is turned by 1 turn (360° turns) to change the compressibility of the acoustic resistance member 40 from 1/6.25 of 0.5 turns to 1/8.33.

Figure 11A:
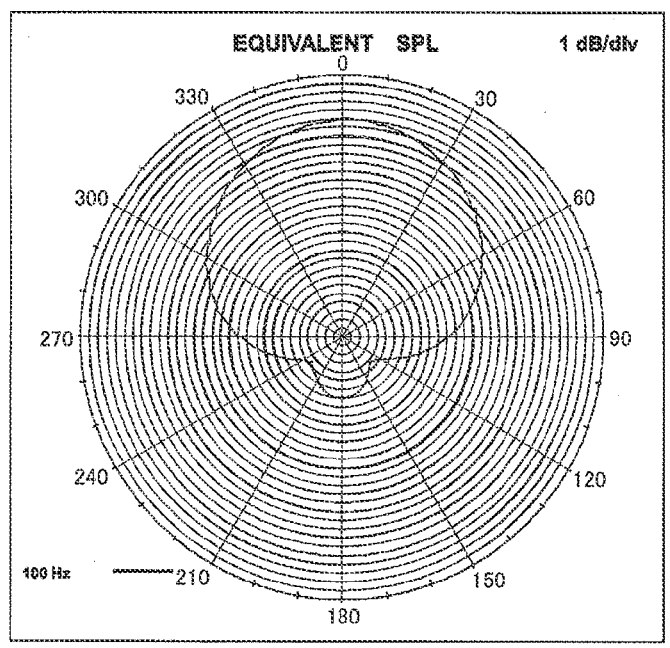
FIG. 11A illustrates a polar pattern obtained at the time of fine adjustment by means of an adjustment nut (1.5 turns) of an acoustic resistance member.
Figure 11B:
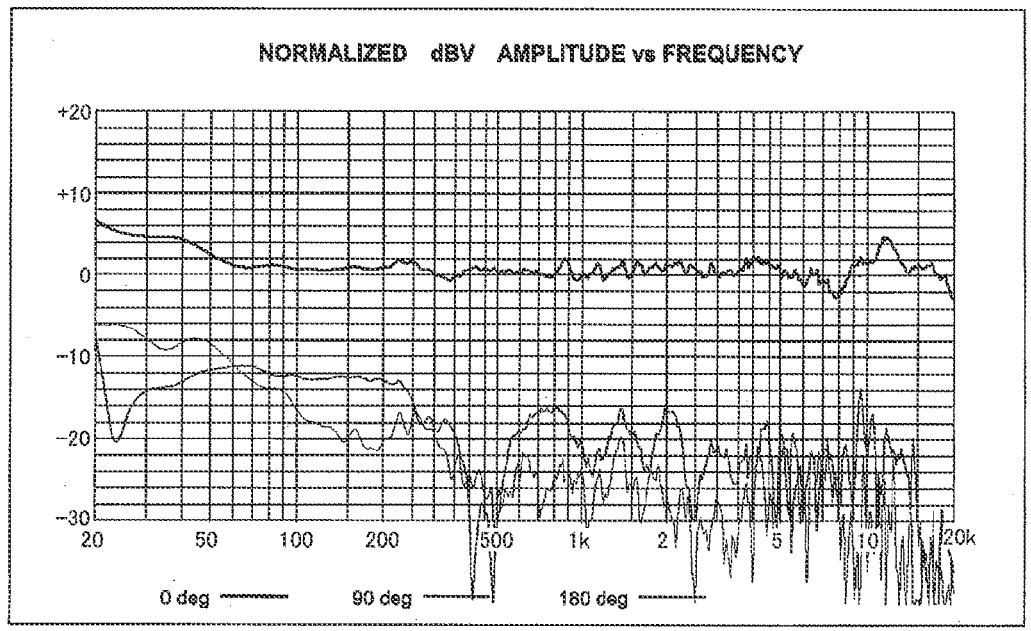
FIG. 11B is a graph showing a directional frequency response for the pattern in FIG. 11A.

Next, FIGS. 11A and 11B show a polar pattern and a directional frequency response characteristic obtained when the adjustment nut 51 is turned by 1.5 turns (540° turns) to change the compressibility of the acoustic resistance member 40 from 1/8.33 of 1.0 turn to 1/12.5.

Figure 12A:
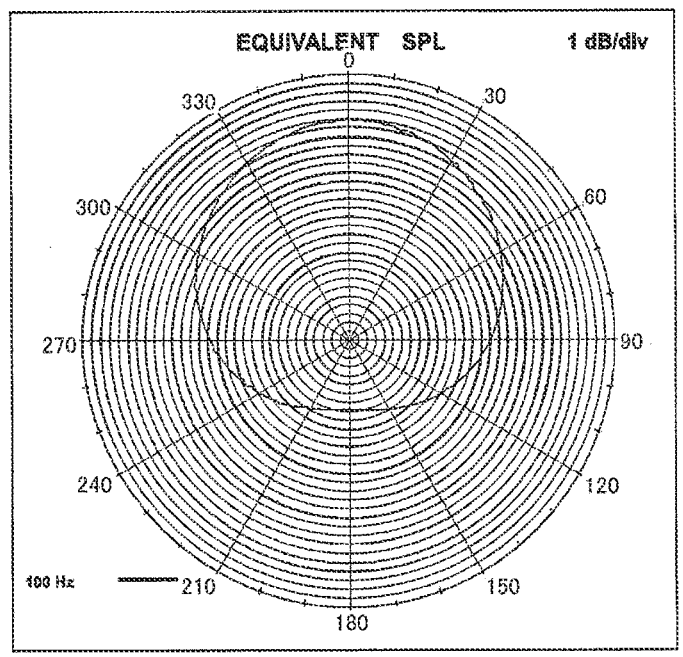
FIG. 12A illustrates a polar pattern obtained at the time of fine adjustment by means of an adjustment nut (2.0 turns) of an acoustic resistance member.
Figure 12B:
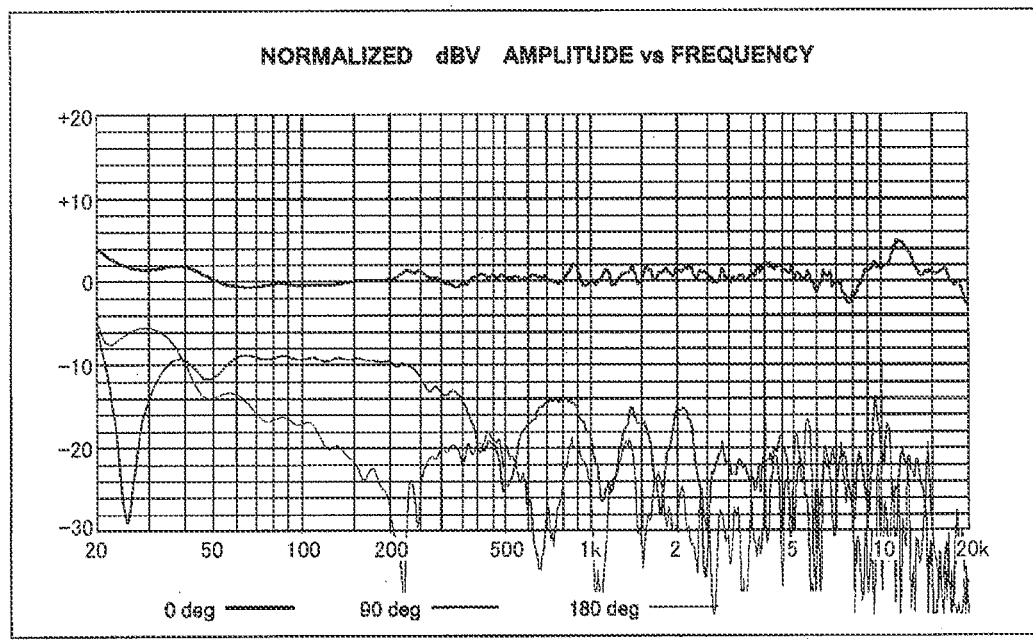
FIG. 12B is a graph showing a directional frequency response for the pattern in FIG. 12A.

Next, FIGS. 12A and 12B show a polar pattern and a directional frequency response characteristic obtained when the adjustment nut 51 is turned by 2.0 turns (720° turns) to change the compressibility of the acoustic resistance member 40 from 1/12.5 of 1.5 turns to 1/25.0.

As can be seen from the polar patterns in FIGS. 8A to 12A, as the compressive force of the acoustic resistance member 40 is increased, a pattern close to a bi-directional pattern (FIG. 8A) continuously changes through unidirectional patterns (FIGS. 9A to 10A) to a pattern close to an omnidirectional pattern. Accordingly, turning of the adjustment nut 51 can be stopped at a desired pattern to obtain an acoustic resistance value for the pattern.

Examine here an optimal acoustic resistance value of the narrow directional long microphone 1C shown in FIG. 4C that has the distance of 433.4 mm between acoustic terminals. When the adjustment nut 51 is turned by 0.5 turns, the amplitudes at 100 Hz decrease by substantially the same level at 90° and 180°. Accordingly, with reference to the acoustic resistance value at 0.5 turns of the adjustment nut 51, an attempt is made to find an optimal value by slightly tightening or loosening the adjustment nut 51 around 0.5 turns.

According to the present invention, as described above, sound holes 32 can be drilled in the insulator 31 as many holes as it is considered that the required acoustic resistance on the side of the rear acoustic terminal 10b is at the lowest, and the acoustic resistance value on the side of the rear acoustic terminal 10b can be coarsely adjusted by using sound hole closing means (preferably the first and second sound hole closing means 42 and 60) to acoustically close a predetermined sound hole 32 among the drilled sound holes 32. Thereafter, acoustic resistance adjusting means 50 (for example, the adjustment nut 51) is used to apply a predetermined amount of compressive force to the acoustic resistance member 40 so as to finely adjust the acoustic resistance value on the rear acoustic terminal side. In this way, the insulator 31 can be designed according to specifications for, for example, the normal unidirectional condenser microphone 1A with a short distance between acoustic terminals as shown in FIG. 4A, and then the insulator 31 can also be applied to a narrow unidirectional condenser microphone with a long distance between acoustic terminals, such as those shown in FIGS. 4B and 4C.

The invention claimed is:

1. A unidirectional condenser microphone comprising:
a microphone unit including a cylindrical unit case having a front acoustic terminal on one end and a rear acoustic terminal on another end,
a fixed pole arranged in the cylindrical unit case,
a diaphragm disposed to face the fixed pole and spaced with a predetermined distance apart from the fixed pole,
an insulator supporting the fixed pole and including a plurality of sound holes dispersed on an entire area thereof, the sound holes directing sound waves from the rear acoustic terminal to a back side of the diaphragm,
an acoustic resistance member including a plurality of sound hole closing members acoustically closing parts of the plurality of sound holes, and
an acoustic resistance adjusting device arranged to sandwich the acoustic resistance member with the insulator and applying a compressive force to the acoustic resistance member to vary an acoustic resistance of the acoustic resistance member,
wherein
the plurality of sound hole closing members is dispersed on an entire surface of the acoustic resistance member at positions facing the part of the plurality of sound holes of the insulator, and the sound waves pass through the sound holes other than the parts of the plurality of sound holes, which are not closed by the sound hole closing members.

2. The unidirectional condenser microphone according to claim 1, wherein each of the plurality of sound hole closing members is composed of a resin material applied or bonded to the acoustic resistance member.

3. The unidirectional condenser microphone according to claim 1, wherein each of the plurality of sound hole closing members is composed of a heated and fused part of the acoustic resistance member.

4. The unidirectional condenser microphone according to claim 1, wherein each of the plurality of sound hole closing members is shaped in a protrusion that fits into one of the plurality of sound holes.

5. The unidirectional condenser microphone according to claim 1, wherein the acoustic resistance adjusting device includes: an adjustment plate that is formed in a disk shape and is in contact with an entire back side of the acoustic resistance member for holding the acoustic resistance member between the adjustment plate and the insulator; and a pressing device that variably applies a pressing force to the adjustment plate, and the sound waves from the rear acoustic terminal enter from a circumstantial surface of the acoustic resistance member to the sound holes other than the part of the plurality of sound holes.

6. A method for adjusting acoustic resistance of a unidirectional condenser microphone, comprising:
preparing a microphone unit including a cylindrical unit case having a front acoustic terminal on one end and a rear acoustic terminal on the other end,
a fixed pole arranged in the cylindrical unit case,
a diaphragm disposed to face the fixed pole and spaced with a predetermined distance apart from the fixed pole,
an insulator supporting the fixed pole and including a plurality of sound holes dispersed on an entire area thereof, the sound holes directing sound waves from the rear acoustic terminal to a back side of the diaphragm,
an acoustic resistance member including a plurality of sound hole closing members acoustically closing parts of the plurality of sound holes, and
an acoustic resistance adjusting device arranged to sandwich the acoustic resistance member with the insulator and applying a compressive force to the acoustic resistance member to vary an acoustic resistance of the acoustic resistance member,
wherein the plurality of sound hole closing members is dispersed on an entire surface of the acoustic resistance member at positions facing the part of the plurality of sound holes of the insulator, and the sound waves pass through the sound holes other than the parts of the plurality of sound holes, which are not closed by the sound hole closing members;
acoustically closing, as a coarse adjustment step, the parts of the plurality of sound holes by the sound hole closing members; and
applying, as a fine adjustment step, a predetermined amount of the compressive force to the acoustic resistance member by the acoustic resistance adjusting device, so as to adjust an acoustic resistance present in a sound wave passage from the rear acoustic terminal to the back side of the diaphragm.

7. The method for adjusting acoustic resistance of a unidirectional condenser microphone according to claim 6, wherein as the plurality of sound hole closing members in the coarse adjustment step, a hardening resin is enclosed in the parts of the plurality of sound holes.

8. The unidirectional condenser microphone according to claim 1, wherein the insulator includes an externally threaded cylinder portion protruding outwardly from a center portion thereof; and the acoustic resistance adjusting device includes an internally threaded hole portion penetrating through a center portion thereof to engage the externally threaded cylinder portion of the insulator, and a plate portion having a diameter larger than that of the acoustic resistance member to cover an entire back side of the acoustic resistance member, and
a pressing force is uniformly applied to the acoustic resistance member through the externally threaded cylinder portion, the internally threaded hole portion and the plate portion.

9. The unidirectional condenser microphone according to claim 8, wherein the acoustic resistance adjusting device is an adjustment nut, and the sound hole closing device protrudes outwardly to fit into the part of the plurality of sound holes such that displacement of the acoustic resistance member is prevented when the adjustment nut is turned to compress the acoustic resistance member.

* * * * *